(12) United States Patent
Chi et al.

(10) Patent No.: US 12,027,923 B2
(45) Date of Patent: Jul. 2, 2024

(54) ELECTRIC MOTOR DRIVING DEVICE

(71) Applicant: LS ELECTRIC CO., LTD., Anyang-si (KR)

(72) Inventors: Min Hun Chi, Anyang-si (KR); Chun Suk Yang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 357 days.

(21) Appl. No.: 17/433,279

(22) PCT Filed: Jul. 11, 2019

(86) PCT No.: PCT/KR2019/008553
§ 371 (c)(1),
(2) Date: Aug. 24, 2021

(87) PCT Pub. No.: WO2020/175749
PCT Pub. Date: Sep. 3, 2020

(65) Prior Publication Data
US 2022/0149705 A1 May 12, 2022

(30) Foreign Application Priority Data
Feb. 25, 2019 (KR) .................. 10-2019-0022035

(51) Int. Cl.
*H05K 5/00* (2006.01)
*H02K 11/33* (2016.01)
(52) U.S. Cl.
CPC ............ *H02K 11/33* (2016.01); *H05K 5/0026* (2013.01); *H02K 2211/03* (2013.01)
(58) Field of Classification Search
CPC ........................................................ H05K 5/00
See application file for complete search history.

(56) References Cited

U.S. PATENT DOCUMENTS

| 5,774,353 A | 6/1998 | Wieloch | |
|---|---|---|---|
| 2005/0270298 A1* | 12/2005 | Thieret | G06F 13/409 345/502 |
| 2016/0329847 A1* | 11/2016 | Mouni | H02K 11/30 |

FOREIGN PATENT DOCUMENTS

| CN | 1972091 A | 5/2007 |
|---|---|---|
| EP | 3211979 A1 | 8/2017 |

(Continued)

OTHER PUBLICATIONS

Supplementary European Search Report for related European Application No. 19916640.6; action dated Nov. 29, 2022; (7 pages).
(Continued)

*Primary Examiner* — Jerry Wu
(74) *Attorney, Agent, or Firm* — K&L Gates LLP

(57) ABSTRACT

The present disclosure relates to a device for driving a motor, including a lower case having an accommodating space formed therein and an open upper side; an upper case closing an open surface of the lower case to form an inner space; a central case disposed in the lower case to partition an inner space formed by the lower case and the upper case; a first board disposed on the lower case and comprising a first connector; a second board disposed on the central case and comprising a second connector; and a connection board disposed in the inner space and comprising a first connection connector electrically connected to the first connector and a second connection connector electrically connected to the second connector to transmit electric signals between the board.

9 Claims, 3 Drawing Sheets

(56) References Cited

FOREIGN PATENT DOCUMENTS

| JP | 2008290616 A | 12/2008 |
|---|---|---|
| JP | 2017158223 A | 9/2017 |
| JP | 2017189033 A | 10/2017 |
| JP | 6361842 B1 | 7/2018 |

OTHER PUBLICATIONS

International Search Report for related International Application No. PCT/KR2019/008553; report dated Sep. 3, 2020; (5 pages).
Written Opinion for related International Application No. PCT/KR2019/008553; report dated Sep. 3, 2020; (4 pages).

\* cited by examiner

ELECTRIC MOTOR DRIVING DEVICE

CROSS-REFERENCE TO RELATED APPLICATIONS

The present application is a National Stage of International Application No. PCT/KR2019/008553 filed on Jul. 11, 2019, which claims the benefit of Korean Patent Application No. 10-2019-0022035, filed on Feb. 25, 2019, with the Korean Intellectual Property Office, the entire contents of each hereby incorporated by reference.

FIELD

The present disclosure relates to a device for driving a motor having an improved structure.

BACKGROUND

In general, the device for driving a motor refers to a device capable of controlling the speed of a motor with high efficiency by supplying power supplied from an external power source to the motor by varying a voltage and a frequency.

As such a conventional device for driving a motor, there is Korean Utility Model Application Laid-Open No. 20-2011-009729 (Title of the Disclosure: Semiconductor Module for Power).

Such a conventional device for driving a motor is reviewed as follows.

In general, the conventional device for driving a motor forms an overall exterior appearance with a case body and a cover, and a circuit unit is accommodated in an internal space formed by the case body and the cover.

In such a circuit unit, a plurality of main circuit boards such as a power board, a filter board, a control board and/or a cap board are disposed, and a plurality of circuit boards are interconnected with a conductor such as a wire or a clamp structure for mutual electrical signal connection. Alternatively, these are interconnected by a cable composed of wires and connectors.

However, the conventional board connection structure has a problem in that it is difficult to implement the automation of assembly, and the wire or cable generates noise signals like an antenna inside the device for driving a motor.

In addition, when the conventional device for driving a motor includes an inner case between the case body and the cover, there is a problem in that any one of the boards must be disposed on the lower side surface of the inner case for connection to the other board disposed on the case body. In such a board arrangement structure, noise may be generated because both boards face each other.

If the board is disposed on the upper side of the inner case to reduce such noise, wires or cables for connecting to other boards disposed on the case body are disposed to be long, thereby complicating the internal structure and increasing noise generation.

SUMMARY

In order to solve the above problems, an object of the present disclosure is to provide a device for driving a motor, which is capable of automating the assembly process and reducing the generation of internal noise by improving the internal structure of the device for driving a motor.

In order to achieve the above object, the present disclosure provides a device for driving a motor, including a lower case having an accommodating space formed therein and an open upper side; an upper case closing an open surface of the lower case to form an inner space; a central case disposed in the lower case to partition an inner space formed by the lower case and the upper case; a first board disposed on the lower case and including a first connector; a second board disposed on the central case and including a second connector; and a connection board disposed in the inner space and including a first connection connector electrically connected to the first connector and a second connection connector electrically connected to the second connector to transmit electric signals between the boards.

In addition, the first board and the second board may be disposed parallel to a bottom surface of the lower case, and the connection board may be disposed perpendicular to a bottom surface of the lower case.

In addition, the second board may be disposed on an upper side surface of the central case.

In addition, the first connector may be disposed on an upper side surface of the first board, wherein the second connector may be disposed on a lower side surface of the second board, and wherein the central case may be formed with a concave portion in which the connection board can be disposed on one side such that the connection board is disposed between an upper side surface of the first board and a lower side surface of the second board.

In addition, it may further include a third board fastened to a support disposed on the lower case between the lower case and the central case, and including a third connector, wherein the connection board may further include a third connection connector electrically connected to the third connector, so as to transmit electric signals between the boards.

In addition, the first board, the second board and the third board may be disposed parallel to a bottom surface of the lower case, and the connection board may be disposed perpendicular to a bottom surface of the lower case.

In addition, the first connector may be disposed on an upper side surface of the first board, wherein the second connector may be disposed on a lower side surface of the second board, wherein the third board may have a protrusion formed to protrude to one side, and the third connector may be disposed on an upper side surface of the protrusion, wherein the central case may be formed with a concave portion in which the connection board can be disposed on one side such that the connection board is disposed between an upper side surface of the first board and a lower side surface of the second board, and wherein the connection board may be formed in a U-shape opened downward such that the first connection connector is disposed on at least one of both sides, the third connection connector is disposed on a concave surface, and the second connection connector is disposed on an upper side surface.

In addition, the connection board may be fastened to the central case.

The present disclosure enables automatic assembly and reduces internal noise at the same time by implementing the mutual electrical connection between main boards by a connection board without wires or cables.

In addition, the present disclosure can secure space efficiency inside a device for driving a motor by changing the shape of an intermediate board and/or a central case such that the connection board can be disposed between the lowermost board and the uppermost board.

EXPLANATION OF REFERENCE NUMERALS

[Explanation of Reference Numerals]

Figure 1:
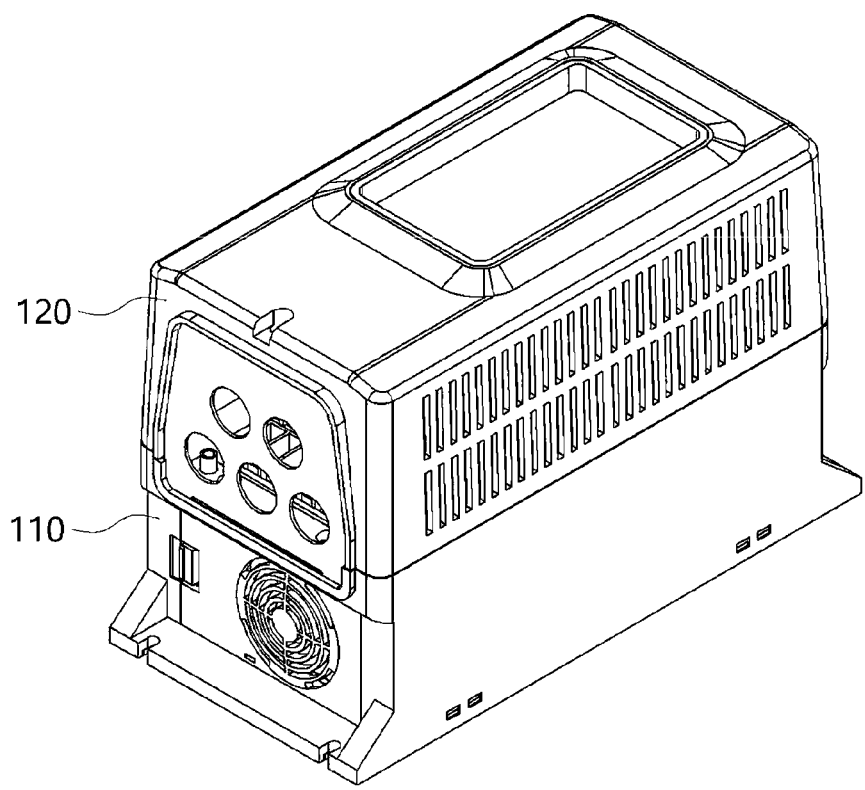
FIG. 1 is a perspective view of the device for driving a motor according to an exemplary embodiment of the present disclosure.

| | |
|---|---|
| 100: Device for driving a motor | 110: Lower case |
| 111: Heat dissipation unit | 112: Cooling fan |
| 113: Support | 120: Upper case |
| 121: Slit | 130: Central case |
| 140: Board unit | 141: First board |
| 141a: First connector | 142: Second board |
| 142a: Second connector | 143: Third board |
| 143a: Third connector | 143b: Protrusion |
| 144: Connection board | 144a: First connection connector |
| 144b: Second connection connector | 144c: Third connection connector |

DETAILED DESCRIPTION

Hereinafter, preferred exemplary embodiments of the present disclosure will be described in detail with reference to the accompanying drawings.

Unless otherwise specified, all terms in the present specification have the same general meanings as understood by those skilled in the art, and if a term used in the present specification conflicts with the general meaning of the term, the definition used in the present specification will be followed.

However, the disclosure to be described below is only for describing the exemplary embodiments of the present disclosure and not for limiting the scope of the present disclosure, and the same reference numerals used throughout the specification indicate the same components.

Figure 2:
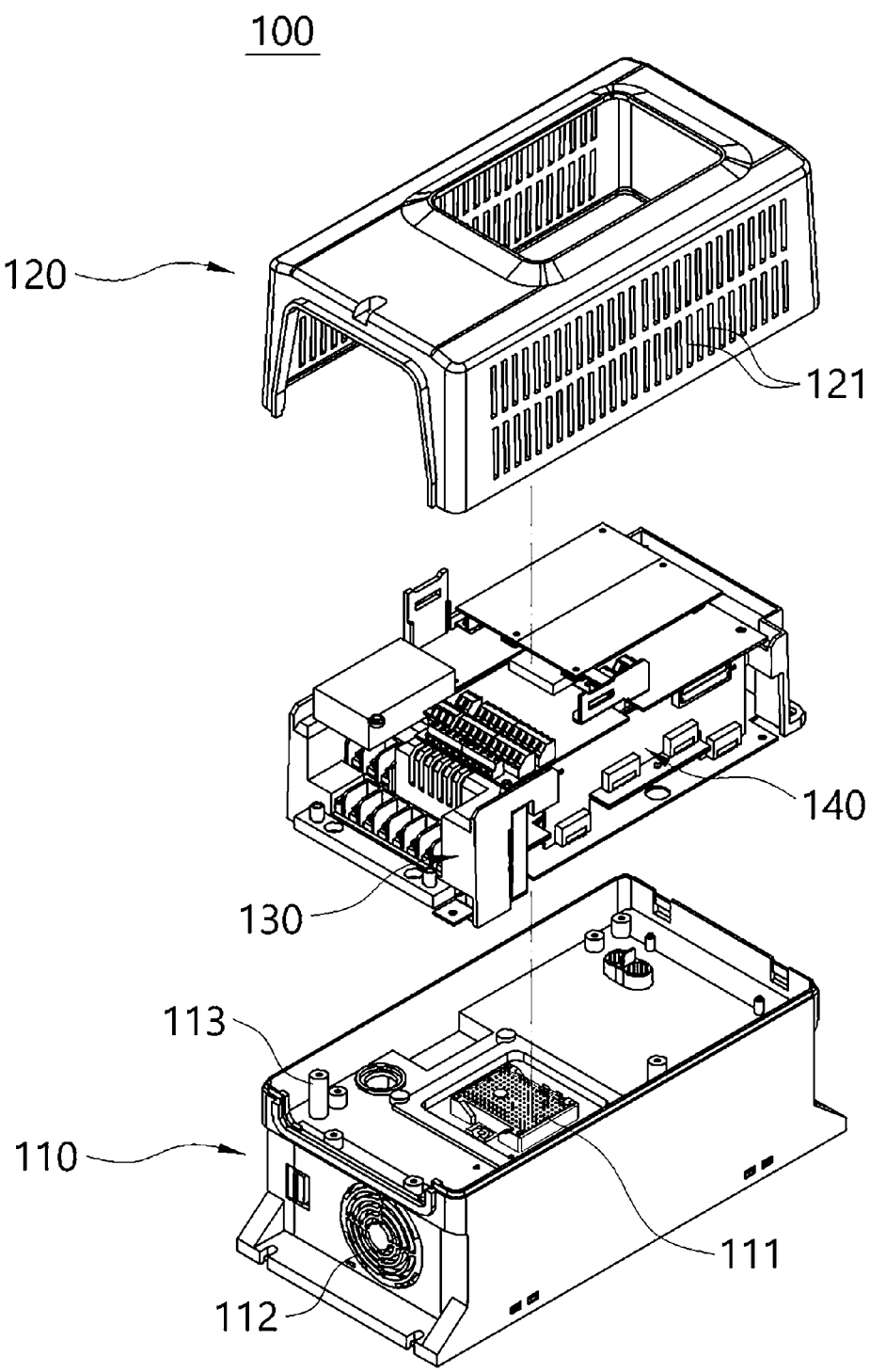
FIG. 2 is an exploded perspective view in which the upper case and the lower case are separated in FIG. 1.
Figure 3:
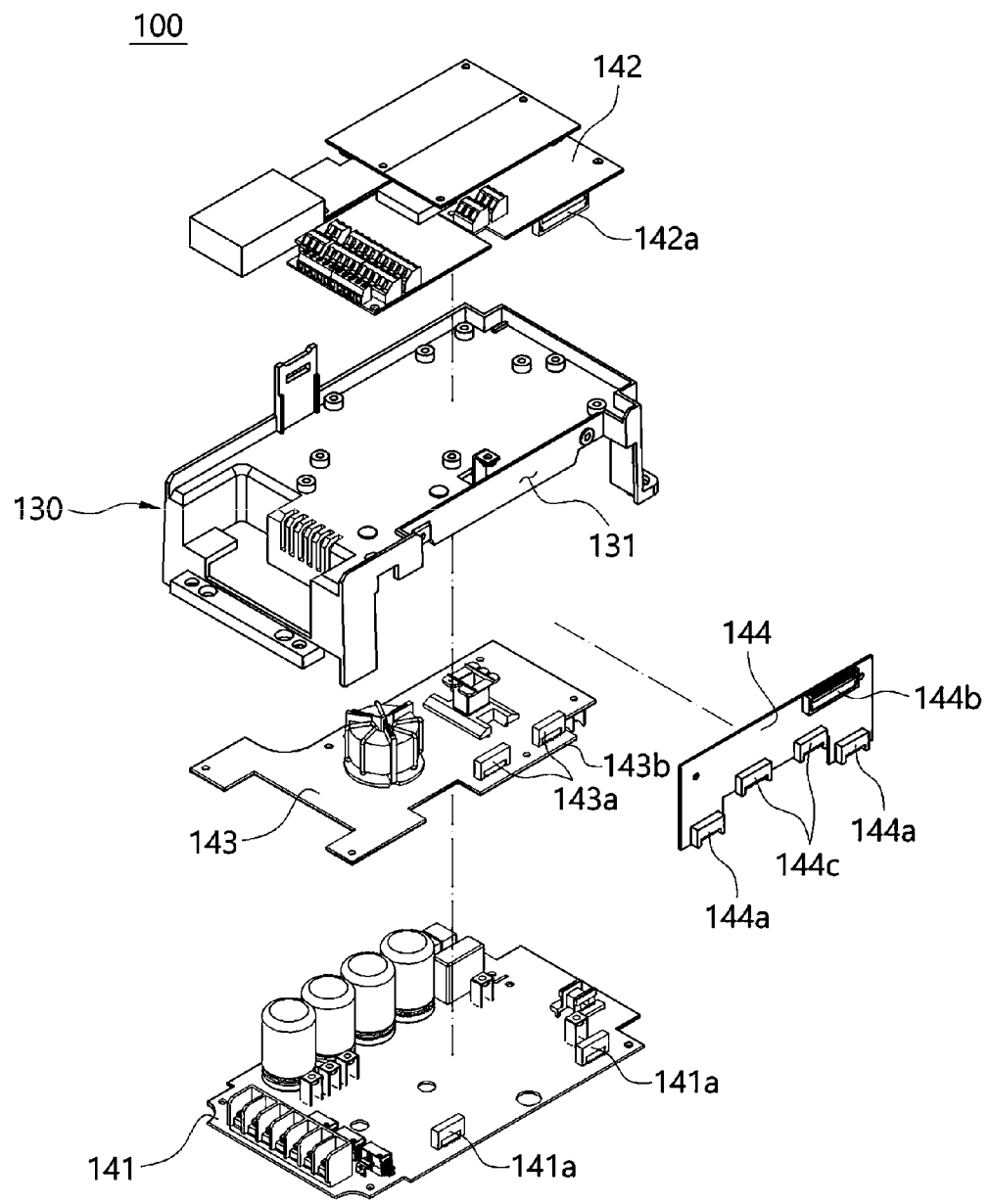
FIG. 3 is an exploded perspective view of the central case and the board unit illustrated in FIG. 2.

FIG. 1 is a perspective view of the device for driving a motor according to an exemplary embodiment of the present disclosure, FIG. 2 is an exploded perspective view in which the upper case and the lower case are separated in FIG. 1, and FIG. 3 is an exploded perspective view of the central case and the board unit illustrated in FIG. 2.

Referring to FIGS. 1 to 3, the device for driving a motor 100 according to an exemplary embodiment of the present disclosure may largely include a lower case 110, an upper case 120, a central case 130 and a board unit 140.

The lower case 110 is a housing having an accommodating space formed therein and an open upper side, and a heat dissipation unit 111 or a cooling fan 112 may be disposed therein. Herein, the lower case 110 may be integrally formed with a heat dissipation part 111 to be described below by injection molding.

The heat dissipation unit 111 is a device for absorbing heat of the board unit 140 to be described below and discharging the same to the outside, and it is also referred to as a heat sink.

The cooling fan 112 supplies external air to the heat dissipation unit 111 and the board unit 140 to cool the heat, and at least one or more cooling fans may be disposed in the lowercase 110.

The upper case 120 may close the open surface of the lower case 110 to form an inner space of the device for driving a motor 100 according to an exemplary embodiment of the present disclosure. A plurality of slits 121 for dissipating heat may be formed on at least one side surface of the upper case 120.

The central case 130 may be disposed on the lower case 110 to partition an inner space formed by the lower case 110 and the upper case 120.

The central case 130 may be fastened to the lower case 110 and disposed in the inner space formed by the lower case 110 and the upper case 120, or it may be disposed between the upper case 120 and the lower case 110 to form an exterior appearance.

The board unit 140 may include at least two or more boards that are distinguished according to their functions, and may include, for example, a first board 141, a second board 142 and a connection board 144.

Each of the boards constituting the board unit 140 may be fixed to the lower case 110 or the central case 130 by bolt fastening and/or hook fastening.

The first board 141 may be disposed on the lower case 110 and include a first connector 141a, and the first board 141 may be, for example, a power board.

Herein, the power board may use a semiconductor device for power to have a function of generating a variable voltage and a variable frequency for driving a motor, a DC-link smoothing function for smoothing the input voltage, and a function of detecting a DC-link voltage and an inverter output current.

In such a power board, IGBT, a power relay, gate driver IC, Hall-CT, DC Reactor, and a snubber capacitor may be mounted as main components.

The second board 142 may be disposed on the central case 130 and include a second connector 142a, and the second board 142 may be, for example, a filter board.

Herein, the filter board may have a filtering function to reduce noise components generated in the inverter from being introduced into the system.

In such a filter board, EMC choke, X-Capacitor, Y-Capacitor and Transformer may be mounted as main components.

The connection board 144 may be disposed in the inner space formed by the lower case 110 and the upper case 120, and include a first connection connector 144a electrically connected to the first connector 141a and a second connection connector 144b electrically connected to the second connector 142 to transmit electrical signals between the boards.

For efficient use of the inner space, the first board 141 and the second board 142 may be disposed parallel to the bottom surface of the lower case 110, and the connection board 144 may be disposed perpendicular to the bottom surface of the lower case 110.

As such a connection board 144, the second board 142 may be disposed on the upper side surface of the central case 130, and even in this structure, there are advantages in which the automatic assembly with the first board 141 is possible and noise generation is not problematic.

In addition, in order to further increase space efficiency, the connection board 144 may be disposed in a space where the first board 141 and the second board 142 face each other.

Specifically, the first connector 141a may be disposed on the upper side surface of the first board 141, the second connector 142a may be disposed on the lower side surface of the second board 142, and the central case 130 may be formed with a concave portion 131 in which the connection board 144 may be disposed on one side thereof such that the connection board 144 is disposed between the upper side surface of the first board 141 and the lower side surface of the second board 141.

According to the technical idea of the present disclosure, effects such as internal space utilization, possibility of automatic assembly, productivity, noise reduction and the like may be further increased when another board is further added.

For example, the present disclosure may further include a third board 14, and in this case, structural features for the above-described connection board 144 may be further included.

The third board 143 may be fastened to a support 113 disposed on the lower case 110 between the lower case 110 and the central case 130, and include a third connector 143a. That is, the third board 143 may be disposed between the first board 141 and the second board 142.

Herein, the third board 143 may be a control board and have a controller function of generating a signal (PWM) for controlling the motor using an operation command, a speed command and voltage and current information.

In such a control board, a micro control unit (MCU) may be mounted as a main component.

The connection board 144 may be disposed in the inner space formed by the lower case 110 and the upper case 120, and the connection board 144 may further include a third connection connector 144c electrically connected to the third connector 143a to transmit electrical signals between the boards.

For efficient use of the inner space, the first board 141, the second board 142 and the third board 143 may be disposed parallel to the bottom surface of the lower case 110, and the connection board 144 may be disposed perpendicular to the bottom surface of the lower case 110.

In addition, in order to further increase space efficiency, the connection board 144 may be disposed in a space where the first board 141 and the second board 142 face each other.

Specifically, the first connector 141a may disposed on the upper side surface of the first board 141, the second connector 142a may be disposed on the lower side surface of the second board 142, and the third board 143 may have a protrusion 143b formed to protrude to one side. In addition, the third connector 143a may be disposed on the upper side surface of the protrusion 143b, and the central case 130 may be formed with a concave portion 131 in which the connection board 144 may be disposed on one side such that the connection board 144 is disposed between the upper side surface of the first board 141 and the lower side surface of the second board 141.

In addition, the connection board 144 may be formed in a U-shape opened downward such that the first connection connector 144a is disposed on at least one of both ends facing downward, and the third connection connector 144c may be disposed on a concave surface, and the second connection connector 144b may be disposed on the upper side surface.

In addition, the connection board 144 may be fastened to the central case 130 so as to be firmly disposed, thereby ensuring reliability of the electrical connection of each board.

In summary, the present disclosure enables automatic assembly and reduces internal noise at the same time by implementing the mutual electrical connection between main boards by the connection board 144 without wires or cables, and by changing the shape of the intermediate substrate and/or the central case 130 such that the connection board 144 may be disposed between the lowermost board and the uppermost board, it is possible to secure space efficiency inside the device for driving a motor 100.

As described above, those skilled in the art will understand that various changes and modifications can be made without departing from the technical spirit of the present disclosure, and the technical scope of the present disclosure is not limited to the contents described in the exemplary embodiments, but should be defined by the claims and their equivalents.

The present disclosure has industrial applicability, because it is possible provide a device for driving a motor, which is capable of automating the assembly process and reducing the generation of internal noise by improving the internal structure.

The invention claimed is:

1. A device for driving a motor, comprising:
   a lower case having an accommodating space formed therein and an open upper side, the open upper side having a heat dissipation unit disposed therein;
   an upper case closing an open surface of the lower case to form an inner space;
   a central case disposed in the accommodating space formed by the lower case to partition an inner space formed by the lower case and the upper case;
   a first board, comprising a power board, disposed on the lower case and comprising a first connector;
   a second board disposed on the central case and comprising a second connector;
   a connection board disposed in the inner space and comprising a first connection connector electrically connected to the first connector and a second connection connector electrically connected to the second connector to transmit electric signals between the first board and the second board; and
   a third board fastened to a support disposed on the lower case between the lower case and the central case, and comprising a third connector,
   wherein the connection board further comprises a third connection connector electrically connected to the third connector, so as to transmit electric signals between the first board, the second board, and the third board; and
   wherein the connection board is formed in a U-shape opened downward such that the first connection connector is disposed on both ends facing downward, and the third connection connector is disposed on a concave surface between the both ends, and the second connection connector is disposed on an upper side surface of the connection board.

2. The device of claim 1, wherein the first board and the second board are disposed parallel to a bottom surface of the lower case, and the connection board is disposed perpendicular to a bottom surface of the lower case.

3. The device of claim 2, wherein the second board is disposed on an upper side surface of the central case.

4. The device of claim 3, wherein the first connector is disposed on an upper side surface of the first board,
   wherein the second connector is disposed on a lower side surface of the second board, and
   wherein the central case is formed with a concave portion in which the connection board can be disposed on one side such that the connection board is disposed between an upper side surface of the first board and a lower side surface of the second board.

5. The device of claim 1, further comprising a third board fastened to a support disposed on the lower case between the lower case and the central case, and comprising a third connector,
   wherein the connection board further comprises a third connection connector electrically connected to the third connector, so as to transmit electric signals between the first board, the second board, and the third board.

6. The device of claim 5, wherein the first board, the second board and the third board are disposed parallel to a bottom surface of the lower case, and the connection board is disposed perpendicular to a bottom surface of the lower case.

7. The device of claim 6, wherein the first connector is disposed on an upper side surface of the first board,
wherein the second connector is disposed on a lower side surface of the second board,
wherein the third board has a protrusion formed to protrude to one side, and the third connector is disposed on an upper side surface of the protrusion,
wherein the central case is formed with a concave portion in which the connection board can be disposed on one side such that the connection board is disposed between an upper side surface of the first board and a lower side surface of the second board.

8. The device according to claim 1, wherein the connection board is fastened to the central case.

9. A device for driving a motor, comprising:
a lower case having an accommodating space formed therein and an open upper side;
an upper case closing an open surface of the lower case to form an inner space;
a central case disposed in the accommodating space formed by the lower case to partition an inner space formed by the lower case and the upper case;
a first board disposed on the lower case and comprising a first connector disposed on an upper side surface of the first board;
a second board disposed on the central case and comprising a second connector disposed on a lower side surface of the second board;
a third board fastened to a support disposed on the lower case between the lower case and the central case, and comprising a third connector; and
a connection board disposed in the inner space and comprising a first connection connector electrically connected to the first connector, a second connection connector electrically connected to the second connector, and a third connection connector electrically connected to the third connector, to transmit electric signals between the first board, the second board, and the third board,
wherein the first board, the second board and the third board are disposed parallel to a bottom surface of the lower case, and the connection board is disposed perpendicular to the bottom surface of the lower case,
wherein the central case is formed with a concave portion in which the connection board can be disposed on one side such that the connection board is disposed between an upper side surface of the first board and a lower side surface of the second board, and
wherein the connection board is formed in a U-shape opened downward such that the first connection connector is disposed on both ends facing downward, and the third connection connector is disposed on a concave surface between the both ends, and the second connection connector is disposed on an upper side surface of the connection board.

* * * * *